United States Patent
Saito et al.

(10) Patent No.: US 9,123,360 B2
(45) Date of Patent: Sep. 1, 2015

(54) OXIDE SPUTTERING TARGET AND PROTECTIVE FILM FOR OPTICAL RECORDING MEDIUM

(71) Applicant: MITSUBISHI MATERIALS CORPORATION, Tokyo (JP)

(72) Inventors: Atsushi Saito, Sanda (JP); Rie Mori, Naka (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 14/375,319

(22) PCT Filed: Feb. 6, 2013

(86) PCT No.: PCT/JP2013/052679
§ 371 (c)(1),
(2) Date: Jul. 29, 2014

(87) PCT Pub. No.: WO2013/118748
PCT Pub. Date: Aug. 15, 2013

(65) Prior Publication Data
US 2015/0010727 A1    Jan. 8, 2015

(30) Foreign Application Priority Data

Feb. 6, 2012 (JP) ................. 2012-023397
Jan. 23, 2013 (JP) ................. 2013-010035

(51) Int. Cl.
| | | |
|---|---|---|
| *B32B 3/02* | (2006.01) | |
| *G11B 7/254* | (2013.01) | |
| *C04B 35/453* | (2006.01) | |
| *G11B 7/257* | (2013.01) | |
| *C04B 35/645* | (2006.01) | |
| *G11B 7/26* | (2006.01) | |
| *C23C 14/08* | (2006.01) | |
| *C23C 14/34* | (2006.01) | |
| *H01J 37/34* | (2006.01) | |

(52) U.S. Cl.
CPC .......... *G11B 7/254* (2013.01); *C04B 35/453* (2013.01); *C04B 35/645* (2013.01); *C04B 35/6455* (2013.01); *C23C 14/086* (2013.01); *C23C 14/3414* (2013.01); *G11B 7/257* (2013.01); *G11B 7/266* (2013.01); *H01J 37/3429* (2013.01); *C04B 2235/3217* (2013.01); *C04B 2235/3241* (2013.01); *C04B 2235/3284* (2013.01); *C04B 2235/3286* (2013.01); *C04B 2235/3287* (2013.01); *C04B 2235/3293* (2013.01); *C04B 2235/5436* (2013.01); *C04B 2235/5445* (2013.01); *C04B 2235/80* (2013.01); *G11B 2007/2571* (2013.01); *G11B 2007/25411* (2013.01); *G11B 2007/25414* (2013.01); *G11B 2007/25417* (2013.01); *G11B 2007/25706* (2013.01); *G11B 2007/25708* (2013.01)

(58) Field of Classification Search
CPC ........................... C32C 14/08; C32C 14/3414
See application file for complete search history.

(56) References Cited

U.S. PATENT DOCUMENTS

| | | | |
|---|---|---|---|
| 2005/0018593 A1* | 1/2005 | Doi et al. ................... | 369/275.2 |
| 2009/0286036 A1* | 11/2009 | Sekiguchi et al. ........... | 428/64.4 |
| 2009/0323495 A1* | 12/2009 | Kitaura et al. ............... | 369/100 |

FOREIGN PATENT DOCUMENTS

| | | |
|---|---|---|
| CN | 101233258 A | 7/2008 |
| JP | 2004-263273 A | 9/2004 |
| JP | 2005-154820 A | 6/2005 |
| JP | 2005-228402 A | 8/2005 |
| JP | 2007-277075 A | 10/2007 |
| JP | 2009-026378 A | 2/2009 |
| JP | 2011-246756 A | 12/2011 |

OTHER PUBLICATIONS

International Search Report dated Apr. 2, 2013, issued for PCT/JP2013/052679.
Office Action dated Jul. 2, 2015 issued for corresponding Chinese Patent Application No. 201380008362.9.

\* cited by examiner

*Primary Examiner* — Elizabeth Mulvaney
(74) *Attorney, Agent, or Firm* — Locke Lord LLP

(57) ABSTRACT

The present invention relates to an oxide sputtering target. By using the oxide sputtering target for formation of a protective film for an optical recording medium, a film, which has high storage stability and breakage resistance due to flexibility, can be deposited. Also, it can be utilized for direct-current sputtering and forms a less amount of particles during sputtering. The oxide sputtering target is made of an oxide sintered body including: with respect to a total content amount of metal compositions, 0.15 at % or more of one or more of Al, Ga, and In as a total content amount; 7 at % or more of Sn; and the balance Zn and inevitable impurities, wherein a total content amount of Al, Ga, In, and Sn is 36 at % or less.

4 Claims, 2 Drawing Sheets

OXIDE SPUTTERING TARGET AND PROTECTIVE FILM FOR OPTICAL RECORDING MEDIUM

TECHNICAL FIELD

The present invention relates to an oxide sputtering target for depositing a protective film for an optical recording medium, which is utilized for an optical recording medium such as CD, DVD, and Blu-ray Disc (registered trade mark: hereinafter referred as "BD"), and a protective film for an optical recording medium deposited by using the oxide sputtering target.

Priority is claimed on Japanese Patent Application No. 2012-023397, filed Feb. 6, 2012, and Japanese Patent Application No. 2013-010035, filed Jan. 23, 2013, the contents of which are incorporated herein by reference.

BACKGROUND ART

In recent years, sizes of digital data recorded on optical recording media have been increased with the availability of highly defined images and movies. Such trends strengthen the demand for a recording media with a higher capacity. As a high capacity optical recording media, BD which is capable of storing 50 GB data by the multi-layer recoding method is already commercially available. In the above-mentioned BD, improvement of the currently available capacity is expected. Thus, research is conducted vigorously for obtaining even higher capacity by multi-stratifying the recoding layer.

RELATED DOCUMENT

Patent Literature

PTL 1: Japanese Unexamined Patent Application, First Publication No. 2009-26378 (refer the paragraph [0058])

PTL 2: Japanese Unexamined Patent Application, First Publication No. 2005-228402 (refer the paragraph [0004])

PTL 3: Japanese Unexamined Patent Application, First Publication No. 2005-154820

DISCLOSURE OF INVENTION

Problems to be Solved by the Invention

The technology described above still has problems explained below.

In a recording medium utilizing an organic dye for the recording layer, the recoding layer deforms in a larger extent compared to the recording layer utilizing an organic compound. Thus, the protective layer next to the dye has to have a lower hardness as described in Patent Literature 1 (PTL 1). Because of this, the film made of ZnS—SiO$_2$ or ITO, which has suitable flexibility (softness), is utilized conventionally.

However, when a sulfur (S) component is include as in ZnS—SiO$_2$, the sulfur and the metal in the reflective coat react each other to reduce the reflectance as described in Patent Literature 2 (PTL 2). Thus, such films have a shortcoming of reduced storage stability as an optical recording medium. Also, in the case of using ITO, many particles are formed during sputtering to deteriorate the quality of the recording film of the recording media. In addition, the particle formation makes cleanup of the production facility cumbersome leading to a poor productivity of the recording media. In Patent Literature 3 (PTL 3), usage of a sputtering target whose major components are: tin oxide; zinc oxide; and an oxide of an element with valency of 3 or more, with tin oxide phase is proposed. However, usage of such a sputtering target causes a particle formation problem during sputtering due to nodulation of the tin oxide phase in the texture.

The present invention is made under the circumstance described above. The purpose of the present invention is to provide an oxide sputtering target for formation of a protective film for an optical recording medium. By using the oxide sputtering target, a film, which has high storage stability, and breakage resistance due to flexibility, can be deposited. Also, it can be utilized for direct-current sputtering and forms a less amount of particles during sputtering.

Means for Solving the Problem

The inventors of the present invention conducted extensive study about ZnO-based sputtering target and found the followings. That is, by adding one or more of: zinc oxide (ZnO); tin oxide (SnO$_2$); aluminum oxide (Al$_2$O$_3$); gallium oxide (Ga$_2$O$_3$); and indium oxide (In$_2$O$_3$) as the raw material of the sputtering target, a ZnO-based oxide sputtering target, by which a film with high storage stability and breakage resistance due to flexibility can be deposited, can be obtained by direct-current (DC) sputtering. Furthermore, in addition to the raw materials mentioned above, by adding one or more of germanium oxide (GeO$_2$) and chromium oxide (Cr$_2$O$_3$), a ZnO-based oxide sputtering target, by which a film with high storage stability and breakage resistance due to flexibility can be deposited, can be obtained Thus, as an example of the present invention, a ZnO-based oxide sputtering target was produced. First, raw material powders of: zinc oxide (ZnO, D$_{50}$=1 μm); tin oxide (SnO$_2$, D$_{50}$=10 μm); and aluminum oxide (Al$_2$O$_3$, D$_{50}$=0.2 μm) were prepared. By using a ball mill apparatus, the raw material powders weighted to obtain a predetermined ratio of each powder were wet-mixed for 16 hours to obtain a mixed powder. Then, the mixed powder was dried and granulated. Then, the mixed powder was subjected to a hot press (HP) process under the pressure of 350 kgf/cm$^2$ for 3 hours at 950° C. The obtained oxide sintered body was machine-worked to be in a predetermined shape to produce the oxide sputtering target.

Next, X-ray diffraction (XRD) analysis was performed on the produced oxide sputtering target. The result is shown in FIG. 1. As indicated in the result, the diffraction peak originated from ZnO and the diffraction peak originated from Zn$_2$SnO$_4$, which is a composite oxide of SnO$_2$ and ZnO, are detected in the oxide sputtering target related to the present invention. It confirms that there were ZnO phase and Zn$_2$SnO$_4$ phase.

Also, the backscattered electron image (CP) and the element distribution image, which shows composition distributions of each element, of the oxide sputtering target related to the present invention were observed with EPMA (field-emission electron probe). The obtained backscattered electron image and the element distribution image are shown in FIG. 2. The element distribution images obtained by EPMA were obtained as colored images. However, each image shown in FIG. 2 is depicted after conversion to a black and white image. Thus, in terms of the gray scale in the black and white images, the lightly grey portion (relatively white part) indicates the portion including a particular element at a higher concentration. Based on the images presented, it is demonstrated that the oxide sputtering target related to the present invention is made of ZnO phase and Zn$_2$SnO$_4$ phase, and Al is selectively dispersed in the ZnO phase.

In the above-explained oxide sputtering target, the raw material powders of: ZnO; SnO$_2$; and Al$_2$O$_3$ were used. In addition to the combination of the raw material powders explained above, it was found that in an oxide sputtering target produce by using the raw material powders of: ZnO; $SnO_2$; and one or more of $Al_2O_3$, and $Ga_2O_3$, $In_2O_3$, the texture of the target is made of ZnO phase and $Zn_2SnO_4$ phase, and one or more of Al, Ga, and In are selectively dispersed in the ZnO phase. Furthermore, in addition to: ZnO; SnO2; and one or more of $Al_2O_3$, and $Ga_2O_3$, $In_2O_3$, it was found that in an oxide sputtering target produce by using the raw material powders of: ZnO; $SnO_2$; one or more of $Al_2O_3$, and $Ga_2O_3$, $In_2O_3$; and one or more of $GeO_2$ and $Cr_2O_3$, the texture of the target is made of ZnO phase and $Zn_2SnO_4$ phase. In texture of the oxide sputtering target: one or more of Al, Ga, and In; and one or more of Ge and Cr, are selectively dispersed in the ZnO phase.

The present invention was made based on the findings described above, and has aspects shown below.

(1) A oxide sputtering target made of an oxide sintered body including: with respect to a total content amount of metal compositions, 0.15 at % or more of one or more of Al, Ga, and In as a total content amount; 7 at % or more of Sn; and the balance Zn and inevitable impurities, wherein
a total content amount of Al, Ga, In, and Sn is 36 at % or less.

(2) A oxide sputtering target made of an oxide sintered body including: with respect to a total content amount of metal compositions, 0.15 at % or more of one or more of Al, Ga, and In as a total content amount; 7 at % or more of Sn; 1.0 to 20.0 at % of one or more of Ge and Cr as a total content amount; and the balance Zn and inevitable impurities, wherein
a total content amount of Al, Ga, In, and Sn is 36 at % or less.

(3) A protective film for an optical recording medium, which is deposited by sputtering using the oxide sputtering target according to (1) described above, wherein the protective film is an oxide with a component composition including: with respect to a total content amount of metal compositions, 0.15 at % or more of one or more of Al, Ga, and In as a total content amount; 7 at % or more of Sn; and the balance Zn and inevitable impurities, wherein a total content amount of Al, Ga, In, and Sn is 36 at % or less.

(4) A protective film for an optical recording medium, which is deposited by sputtering using the oxide sputtering target according to (2) described above, wherein the protective film is an oxide with a component composition including: with respect to a total content amount of metal compositions, 0.15 at % or more of one or more of Al, Ga, and In as a total content amount; 7 at % or more of Sn; 1.0 to 20.0 at % of one or more of Ge and Cr as a total content amount; and the balance Zn and inevitable impurities, wherein a total content amount of Al, Ga, In, and Sn is 36 at % or less.

The above-described oxide sputtering targets related to the present invention is the oxide with the component composition including: with respect to a total content amount of metal compositions, 0.15 at % or more of one or more of Al, Ga, and In as a total content amount; 7 at % or more of Sn; and the balance Zn and inevitable impurities, wherein a total content amount of Al, Ga, In, and Sn is 36 at % or less. Therefore, specific resistance during sputtering is low enabling the direct-current (DC) sputtering stably. Thus, the film deposited by using the oxide sputtering target has a less extent of variation of reflectance as an optical recording media and high storage stability. Moreover, the film has flexibility and breakage-resistance.

In addition to the reduction of specific resistance of the sputtering target due to formation of carriers of Al, Ga, or In dissolved in ZnO, it is believed that thermal damage can be mitigated by improvement of thermal diffusivity of the deposited film The reason for setting the total content amount of one or more of Al, Ga, and In to 0.15 at % or more in the above-described oxide sputtering target is that if it was less that 0.15 at %, the direct-current (DC) sputtering would become unstable making it easier to cause breakage of the film. It is preferable that the total content amount of one or more of Al, Ga, and In is set in the range of 0.20 at % or more and 6.0 at % or less. The reason for setting the content amount of Sn to 7 at % or more is that if it is less than 7 at %, the hardness of the film (indentation hardness which is explained later) would become 800 mgf/$\mu m^2$ or more and make the film harder. It is preferable that the content amount of Sn is set in the range of 7 at % or more and 30 at % or less. The reason for setting the total content amount of Al, Ga, In, and Sn to 36 at % or less is that if it exceeded 36 at %, tin oxide phase would reside within the texture of the sputtering target. The nodules are formed in the sputtering target due to the resided tin oxide phase, causing frequent occurrence of particle formation or abnormal electrical discharge during sputtering.

Also, in an oxide sputtering target related present invention, 1.0 to 20.0 at % of one or more of Ge and Cr as a total content amount is included. The reason for setting the total content amount of Cr and Ge to 20 at % or less is that if it exceeded 20 at %, the specific resistance of the target would become too high making it difficult to perform the direct-current (DC) sputtering stably. In order to make it possible to perform the direct-current (DC) sputtering, it is preferable that the specific resistance of the sputtering target is set to 1 $\Omega \cdot cm$ or less. Particularly, in order to perform the direct-current (DC) sputtering stably, it is preferable that the specific resistance of the sputtering target is set to 0.1 $\Omega \cdot cm$ or less. Even more preferably, it is set to 0.01 $\Omega \cdot cm$ or less.

Therefore, in producing of the oxide sputtering target related to the present invention, each of raw material powders of: ZnO; $SnO_2$; $Al_2O_3$; $Ga_2O_3$; $In_2O_3$; $GeO_2$; and $Cr_2O_3$, is prepared. Then, each of raw powders are weighted in order to obtain a component composition of the protective film for an optical recording media intended to be deposited.

Then, the weighted raw material powders and 3 times weight of zirconia balls (diameter: 5 mm) were placed in a plastic container. Then, the contents in the plastic container were wet-mixed with a ball mill apparatus for 16 hours. During mixing, for example, alcohol was used as a solvent. Next, the obtained mixed powder was dried and granulated. Then, an oxide sintered body was obtained by performing the hot press (HP) process under a vacuum or an inert gas atmosphere under pressure of 150 to 400 kgf/$cm^2$ for 2 to 9 hours at 850-1050° C., or preferably at 900-1000° C. Then, the obtained oxide sintered body is machine-worked into a predetermined shape to obtain an oxide sputtering target.

The protective film for an optical recording media, which is deposited by using the oxide sputtering target produced as describe above, has the identical component composition to the oxide sputtering target. Thus, it includes: with respect to a total amount of metal compositions, 0.15 at % or more of one or more of Al, Ga, and In as a total amount; 7 at % or more of Sn; and the balance Zn and inevitable impurities, wherein a total amount of Al, Ga, In, and Sn is 36 at % or less. Alternatively, it includes: with respect to a total amount of metal compositions, 0.15 at % or more of one or more of Al, Ga, and In as a total amount; 7 at % or more of Sn; 1.0 to 20.0 at % of one or more of Ge and Cr as a total amount; and the balance Zn and inevitable impurities, wherein a total amount of Al, Ga, In, and Sn is 36 at % or less.

Therefore, the film has a less extent of variation of reflectance and high storage stability. Moreover, the film becomes appropriately flexible and resistant to breakage. Thus, the film is suitable for utilizing to the protective film of the multi-layered BD in which the recoding layer with an organic dye is used, for example.

Effects of the Invention

According to the oxide sputtering target related to the present invention, the oxide sputtering target is made of an oxide sintered body including: with respect to a total content amount of metal compositions, 0.15 at % or more of one or more of Al, Ga, and In as a total content amount; 7 at % or more of Sn; and the balance Zn and inevitable impurities, wherein a total content amount of Al, Ga, In, and Sn is 36 at % or less. Alternatively, it is made of an oxide sintered body including: with respect to a total content amount of metal compositions, 0.15 at % or more of one or more of Al, Ga, and In as a total content amount; 7 at % or more of Sn; 1.0 to 20.0 at % of one or more of Ge and Cr as a total content amount; and the balance Zn and inevitable impurities, wherein a total content amount of Al, Ga, In, and Sn is 36 at % or less. Because the configurations described above, it becomes possible to perform the direct-current (DC) sputtering stably. Moreover, a film, which has high storage stability and breakage resistance due to a suitable flexibility, can be deposited.

Therefore, the protective film for an optical recording medium deposited by using the oxide sputtering target related to the present invention is suitable for utilizing to the dielectric material protective film of BD, which uses an organic dye as a recording layer.

BEST MODE FOR CARRYING OUT THE INVENTION

Figure 1:
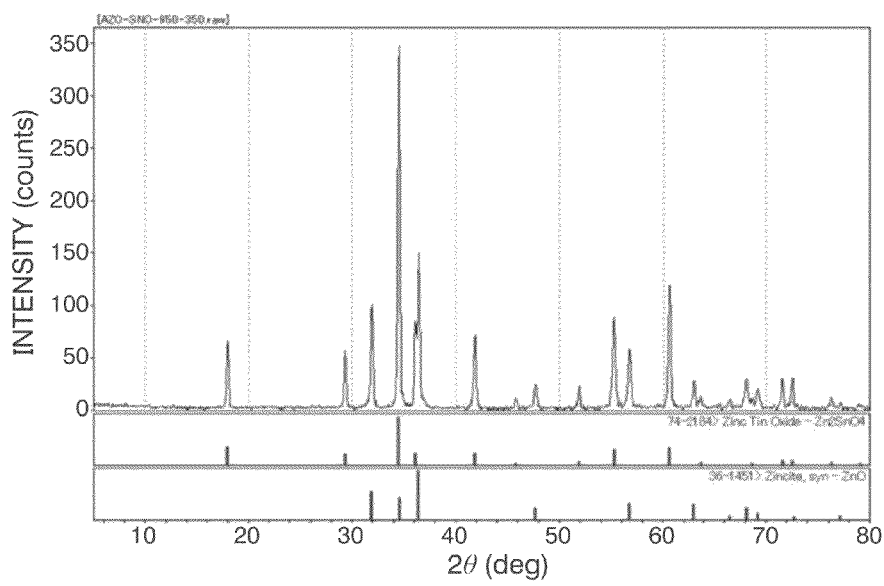
FIG. 1 is a graph showing results of X-ray diffraction (XRD) analysis of the oxide sputtering target related to the present invention.

Embodiments of the oxide sputtering target and the protective film for an optical recording media, which are related to the present invention, are explained in detail below.

The protective film for an optical recording media deposited by sputtering using the oxide sputtering target related to the present invention is an oxide an oxide including: with respect to a total content amount of metal compositions, 0.15 at % or more of one or more of Al, Ga, and In as a total content amount; 7 at % or more of Sn; and the balance Zn and inevitable impurities, wherein a total content amount of Al, Ga, In, and Sn is 36 at % or less. Alternatively, the protective film is made of an oxide including: with respect to a total content amount of metal compositions, 0.15 at % or more of one or more of Al, Ga, and In as a total content amount; 7 at % or more of Sn; 1.0 to 20.0 at % of one or more of Ge and Cr as a total content amount; and the balance Zn and inevitable impurities, wherein a total content amount of Al, Ga, In, and Sn is 36 at % or less.

Thus, in order to produce the oxide sputtering target, raw material powders of: zinc oxide (chemical formula: ZnO, $D_{50}$=1 μm); tin oxide (chemical formula: $SnO_2$, $D_{50}$=16 μm); aluminum oxide (chemical formula: $Al_2O_3$, $D_{50}$=0.2 μm); gallium oxide (chemical formula: $Ga_2O_3$, $D_{50}$=1.7 μm); indium oxide (chemical formula: $In_2O_3$, $D_{50}$=11 μm); germanium oxide (chemical formula: $GeO_2$, $D_{50}$=1.0 μm); and chromium oxide (chemical formula: $Cr_2O_3$, $D_{50}$=0.4 μm), were prepared. Then, each of the raw material powders were selected and weighted in order to obtain the above-described component composition of the protective film for an optical recording media. Component compositions (mol %) of each of the raw material powders are shown in Table 1.

Then, the weighted raw material powders and 3 times weight of zirconia balls (diameter: 5 mm) were placed in a plastic container. Then, the contents in the plastic container were wet-mixed with a ball mill apparatus for 16 hours to obtain the mixed powders of Examples 1-26 (Ex. 1-26). During mixing, alcohol was used as a solvent. Next, the obtained mixed powders of Examples 1-26 were dried and granulated. Then, each of the oxide sintered bodies were obtained by performing the hot press (HP) process under a vacuum under pressure of 350 kgf/cm² for 3 hours at 950° C. Then, the obtained oxide sintered bodies were machine-worked to obtain the oxide sputtering targets of Examples 1-26. The target size was set to diameter of 125 mm×thickness of 5 mm.

Furthermore, for a comparison to the present embodiment of the oxide sputtering targets related to the present invention, oxide sputtering targets excluded from the scope of the present invention were produced.

The oxide sputtering target of Comparative Example 1 was produced by using the raw material powders of only Zn and $SnO_2$, but without the raw material powders of $Al_2O_3$, $Ga_2O_3$, and $In_2O_3$. As in the cases including the raw material powders of $Al_2O_3$, $Ga_2O_3$, and $In_2O_3$, but their component composition ratios are out of the range configured in the present invention, the oxide sputtering targets of Comparative Examples 2 and 3 were produced. Also, as in the cases including the raw material powders of $Al_2O_3$, $Ga_2O_3$, and $In_2O_3$ and further including at least one of $GeO_2$ and $Cr_2O_3$, but their component composition ratios are out of the range configured in the present invention, the oxide sputtering targets of Comparative Examples 4-6 were produced. Also, the conventional sputtering targets of ZnS—$SiO_2$ (Comparative Example 7) and ITO (Comparative Example 8) were procured. ZnS—$SiO_2$ is the ZSSO target (20 mol % $SiO_2$) manufactured by Mitsubishi Materials Corporation Ltd. ITO is the ITO target (10 wt % $SnO_2$) manufactured by Mitsubishi Materials Corporation Ltd. The above-mentioned oxide sputtering target of Comparative Examples 1-8 (C. Ex. 1-8) were produced by following the identical production procedure to the oxide sputtering targets of Examples 1-26. The material composition (mol %) of each of the raw material powders related to the oxide sputtering targets of Comparative Examples 1-8 are shown in Table 1.

TABLE 1

| | Raw Material Composition (mol %) | | | | | | |
|---|---|---|---|---|---|---|---|
| | $Al_2O_3$ | $Ga_2O_3$ | $In_2O_3$ | $SnO_2$ | $GeO_2$ | $Cr_2O_3$ | ZnO |
| Ex. 1 | 0.1 | — | — | 20 | — | — | Balance |
| Ex. 2 | 3 | — | — | 30 | — | — | Balance |

TABLE 1-continued

| | Raw Material Composition (mol %) | | | | | | |
|---|---|---|---|---|---|---|---|
| | Al$_2$O$_3$ | Ga$_2$O$_3$ | In$_2$O$_3$ | SnO$_2$ | GeO$_2$ | Cr$_2$O$_3$ | ZnO |
| Ex. 3 | 3 | — | — | 15 | — | — | Balance |
| Ex. 4 | 3 | — | — | 20 | — | — | Balance |
| Ex. 5 | 3 | — | — | 25 | — | — | Balance |
| Ex. 6 | 3 | — | — | 8 | — | — | Balance |
| Ex. 7 | — | 0.1 | — | 20 | — | — | Balance |
| Ex. 8 | — | 3 | — | 20 | — | — | Balance |
| Ex. 9 | — | — | 0.1 | 20 | — | — | Balance |
| Ex. 10 | — | — | 3 | 20 | — | — | Balance |
| Ex. 11 | 1.5 | 1.5 | — | 20 | — | — | Balance |
| Ex. 12 | 1.5 | — | 1.5 | 20 | — | — | Balance |
| Ex. 13 | — | 1.5 | 1.5 | 20 | — | — | Balance |
| Ex. 14 | 1 | 1 | 1 | 20 | — | — | Balance |
| Ex. 15 | 3 | — | — | 20 | 1 | — | Balance |
| Ex. 16 | 3 | — | — | 20 | 5 | — | Balance |
| Ex. 17 | 3 | — | — | 20 | 10 | — | Balance |
| Ex. 18 | 3 | — | — | 20 | 20 | — | Balance |
| Ex. 19 | 3 | — | — | 20 | — | 1 | Balance |
| Ex. 20 | 3 | — | — | 20 | — | 5 | Balance |
| Ex. 21 | 3 | — | — | 20 | — | 11 | Balance |
| Ex. 22 | 3 | — | — | 20 | 5 | 5 | Balance |
| Ex. 23 | — | 3 | — | 20 | 10 | — | Balance |
| Ex. 24 | — | 3 | — | 20 | — | 5 | Balance |
| Ex. 25 | — | — | 3 | 20 | 10 | — | Balance |
| Ex. 26 | — | — | 3 | 20 | — | 5 | Balance |
| C. Ex. 1 | — | — | — | 20 | — | — | Balance |
| C. Ex. 2 | 3 | — | — | 32 | — | — | Balance |
| C. Ex. 3 | 3 | — | — | 6 | — | — | Balance |
| C. Ex. 4 | 3 | — | — | 20 | 25 | — | Balance |
| C. Ex. 5 | 3 | — | — | 20 | — | 14 | Balance |
| C. Ex. 6 | 3 | — | — | 20 | 12 | 6 | Balance |
| C. Ex. 7 | (ZnS)80(SiO$_2$)20 mol % | | | | | | |
| C. Ex. 8 | ITO(10 wt % SnO$_2$) | | | | | | |

Then, analysis of the metal composition was performed to the produced oxide sputtering targets of Examples 1-26 and Comparative Examples 1-8. Results of the analysis are shown in Table 2.

TABLE 2

| | Target Composition (at % with respect to total metal compositions) | | | | | | |
|---|---|---|---|---|---|---|---|
| | Al | Ga | In | Sn | Al + Ga + In + Sn | Ge + Cr | ZnO |
| Ex. 1 | 0.20 | — | — | 20.0 | 20.20 | — | Balance |
| Ex. 2 | 5.83 | — | — | 29.1 | 34.93 | — | Balance |
| Ex. 3 | 5.83 | — | — | 14.6 | 20.43 | — | Balance |
| Ex. 4 | 5.83 | — | — | 19.4 | 25.23 | — | Balance |
| Ex. 5 | 5.83 | — | — | 24.3 | 30.13 | — | Balance |
| Ex. 6 | 5.83 | — | — | 7.8 | 13.63 | — | Balance |
| Ex. 7 | — | 0.20 | — | 20.0 | 20.20 | — | Balance |
| Ex. 8 | — | 5.83 | — | 19.4 | 25.23 | — | Balance |
| Ex. 9 | — | — | 0.20 | 20.0 | 20.20 | — | Balance |
| Ex. 10 | — | — | 5.83 | 19.4 | 25.23 | — | Balance |
| Ex. 11 | 2.91 | 2.91 | — | 19.4 | 25.23 | — | Balance |
| Ex. 12 | 2.91 | — | 2.91 | 19.4 | 25.23 | — | Balance |
| Ex. 13 | — | 2.91 | 2.91 | 19.4 | 25.23 | — | Balance |
| Ex. 14 | 1.94 | 1.94 | 1.94 | 19.4 | 25.23 | — | Balance |
| Ex. 15 | 5.83 | — | — | 19.4 | 25.23 | 1.0 | Balance |
| Ex. 16 | 5.83 | — | — | 19.4 | 25.23 | 4.9 | Balance |
| Ex. 17 | 5.83 | — | — | 19.4 | 25.23 | 9.7 | Balance |
| Ex. 18 | 5.83 | — | — | 19.4 | 25.23 | 19.4 | Balance |
| Ex. 19 | 5.77 | — | — | 19.2 | 24.97 | 1.0 | Balance |
| Ex. 20 | 5.56 | — | — | 18.5 | 24.06 | 9.3 | Balance |
| Ex. 21 | 5.26 | — | — | 17.5 | 22.76 | 19.3 | Balance |
| Ex. 22 | 5.56 | — | — | 18.5 | 24.06 | 13.9 | Balance |
| Ex. 23 | — | 5.83 | — | 19.4 | 19.42 | 9.7 | Balance |
| Ex. 24 | — | 5.56 | — | 18.5 | 18.50 | 9.3 | Balance |
| Ex. 25 | — | — | 5.83 | 19.4 | 19.42 | 9.7 | Balance |
| Ex. 26 | — | — | 5.56 | 18.5 | 18.50 | 9.3 | Balance |

TABLE 2-continued

| | Target Composition (at % with respect to total metal compositions) | | | | | | |
|---|---|---|---|---|---|---|---|
| | Al | Ga | In | Sn | Al + Ga + In + Sn | Ge + Cr | ZnO |
| C. Ex. 1 | — | — | — | 20.0 | 20.00 | — | Balance |
| C. Ex. 2 | 5.83 | — | — | 31.1 | 36.93 | — | Balance |
| C. Ex. 3 | 5.83 | — | — | 5.8 | 11.63 | — | Balance |
| C. Ex. 4 | 5.83 | — | — | 19.4 | 25.23 | 24.3 | Balance |
| C. Ex. 5 | 5.13 | — | — | 17.1 | 22.23 | 23.9 | Balance |
| C. Ex. 6 | 5.50 | — | — | 18.3 | 23.80 | 22.9 | Balance |
| C. Ex. 7 | (ZnS)80(SiO$_2$)20 mol % | | | | | | |
| C. Ex. 8 | ITO(10 wt % SnO$_2$) | | | | | | |

Next, by using the produced oxide sputtering targets of Examples 1-26 and Comparative Examples 1-8, the protective films for an optical recording media of Examples 1-26 and Comparative Examples 1-8 were deposited in the deposition conditions explained below.

[Deposition Condition]
Power source: DC500W (partially radio frequency (RF) sputtering)
Total pressure: Ar=47.5 sccm, O$_2$=2.5 sccm (except for Comparative Example 7 in which Ar=50 sccm, O$_2$=0 sccm)
Distance between target and substrate (TS): 70 mm Then, analysis of the metal composition was performed to the protective films of Examples 1-26 and Comparative Examples 1-8 for an optical recording media, which were deposited by using the oxide sputtering targets of Examples 1-26 and Comparative Examples 1-8 under the deposition condition explained above. Results of the analysis are shown in Table 3. Based on the results, it was demonstrated that the metal compositions of the protective films of Examples 1-26 and Comparative Examples 1-8 for an optical recording media correspond to the metal compositions of the oxide sputtering targets of Examples 1-26 and Comparative Examples 1-8

TABLE 3

| | Film Composition (at % with respect to total metal compositions) | | | | | | |
|---|---|---|---|---|---|---|---|
| | Al | Ga | In | Sn | Al + Ga + In + Sn | Ge + Cr | ZnO |
| Ex. 1 | 0.20 | — | — | 19.5 | 19.70 | — | Balance |
| Ex. 2 | 5.86 | — | — | 28.8 | 34.66 | — | Balance |
| Ex. 3 | 5.88 | — | — | 15.0 | 20.88 | — | Balance |
| Ex. 4 | 5.79 | — | — | 20.1 | 25.89 | — | Balance |
| Ex. 5 | 5.80 | — | — | 25.5 | 31.30 | — | Balance |
| Ex. 6 | 5.82 | — | — | 7.3 | 13.12 | — | Balance |
| Ex. 7 | — | 0.18 | — | 21.0 | 21.18 | — | Balance |
| Ex. 8 | — | 5.82 | — | 19.9 | 25.72 | — | Balance |
| Ex. 9 | — | — | 0.19 | 18.9 | 19.09 | — | Balance |
| Ex. 10 | — | — | 5.90 | 19.9 | 25.80 | — | Balance |
| Ex. 11 | 2.90 | 2.88 | — | 18.9 | 24.68 | — | Balance |
| Ex. 12 | 28.20 | — | 2.87 | 20.0 | 25.69 | — | Balance |
| Ex. 13 | — | 2.93 | 2.99 | 18.7 | 24.62 | — | Balance |
| Ex. 14 | 1.99 | 1.95 | 1.88 | 20.5 | 26.32 | — | Balance |
| Ex. 15 | 5.83 | — | — | 19.6 | 25.43 | 1.1 | Balance |
| Ex. 16 | 5.83 | — | — | 19.4 | 25.24 | 5.0 | Balance |
| Ex. 17 | 5.83 | — | — | 20.1 | 25.93 | 9.3 | Balance |
| Ex. 18 | 5.79 | — | — | 18.8 | 24.59 | 19.5 | Balance |
| Ex. 19 | 5.67 | — | — | 19.4 | 25.09 | 0.9 | Balance |
| Ex. 20 | 5.46 | — | — | 19.2 | 24.66 | 4.3 | Balance |
| Ex. 21 | 5.22 | — | — | 17.0 | 22.22 | 9.2 | Balance |
| Ex. 22 | 5.77 | — | — | 19.2 | 24.97 | 9.1 | Balance |
| Ex. 23 | — | 5.78 | — | 19.6 | 25.38 | 9.3 | Balance |
| Ex. 24 | — | 5.38 | — | 19.7 | 25.08 | 9.8 | Balance |

TABLE 3-continued

| | Film Composition (at % with respect to total metal compositions) | | | | | | |
|---|---|---|---|---|---|---|---|
| | Al | Ga | In | Sn | Al + Ga + In + Sn | Ge + Cr | ZnO |
| Ex. 25 | — | — | 5.86 | 19.6 | 25.46 | 9.9 | Balance |
| Ex. 26 | — | — | 5.49 | 20.0 | 25.49 | 8.9 | Balance |
| C. Ex. 1 | — | — | — | 20.2 | 20.00 | — | Balance |
| C. Ex. 2 | 5.77 | — | — | 30.5 | 36.27 | — | Balance |
| C. Ex. 3 | 5.83 | — | — | 6.0 | 11.83 | — | Balance |
| C. Ex. 4 | 5.88 | — | — | 18.9 | 24.78 | 23.8 | Balance |
| C. Ex. 5 | 5.08 | — | — | 18.0 | 23.08 | 22.8 | Balance |
| C. Ex. 6 | 5.78 | — | — | 19.5 | 25.28 | 22.9 | Balance |

Then, the oxide sputtering targets of Examples 1-26 and Comparative Examples 1-8; and the protective films for an optical recording media deposited by using these targets of Examples 1-26 and Comparative Examples 1-8 were evaluated. In regard to the oxide sputtering targets of Examples 1-26 and Comparative Examples 1-8: density ratio; specific resistance; the number of abnormal electrical discharges; and the amount of particles, were obtained. In regard to the protective films of Examples 1-26 and Comparative Examples 1-8 for an optical recording media: indentation hardness; breakage of the film; XRD of the film; and variation of reflectance, were obtained. The ways to obtain these values are explained below.

Density ratio was calculated by dividing the bulk density by the theoretical density after machine-working of the sintered bodies in a predetermined shape and measuring their weights to obtain the bulk density. The theoretical density was obtained based on the weights of raw materials as indicated below.

[Equation 1]

$$\rho_{fn} = \frac{1}{\left(\frac{C_1/100}{\rho_1} + \frac{C_2/100}{\rho_2} + \frac{C_3/100}{\rho_3} + \frac{C_4/100}{\rho_4} + \frac{C_5/100}{\rho_5} + \frac{C_6/100}{\rho_6} + \frac{C_7/100}{\rho_7}\right)} \quad (1)$$

Unit g/cm³

$\rho_1$: Al₂O₃ density   $C_1$: Al₂O₃ wt %
$\rho_2$: Ga₂O₃ density   $C_2$: Ga₂O₃ wt %
$\rho_3$: In₂O₃ density   $C_3$: In₂O₃ wt %
$\rho_4$: ZnO density    $C_4$: ZnO wt %
$\rho_5$: SnO₂ density   $C_5$: SnO₂ wt %
$\rho_6$: GeO₂ density   $C_6$: GeO₂ wt %
$\rho_7$: Cr₂O₃ density   $C_7$: Cr₂O₃ wt %
$\rho_{fn}$: Theoritical density

[Specific Resistance Measurement]

Specific resistance of the sputtering targets and films was measured by using the resistance measurement apparatus Loresta-GP manufacture by Mitsubishi Chemical Corporation Ltd.

[Abnormal Discharges and Particles]

Under the condition described above, sputtering was performed for 12 hours and the number of abnormal electrical discharges was counted. After sputtering, the sputter chamber was released, and the amount of the particles in the chamber was obtained.

[Variation of Reflectance]

Alloy of $Ag_{98.1}Nd_{1.0}Cu_{0.9}$ was sputtered on polycarbonate. Then, by using a substrate on which the dye described in Example 1 of PTL 1 was deposited, each protective film of Examples and Comparative Examples was deposited on it in the thickness of 14 nm under the condition described above. After that, they were allowed to stand for 100 hours at 80° C. in a thermo-hygrostat set to 85% of humidity. Then, variation of reflectance was measured before and after the still standing. For the measurement of the reflectance, a UV-visible light spectrophotometer (Model V-550 manufacture by JASCO Corporation) was used. The reflectance was measured using the light with a wave length of 405 nm.

[Indentation Hardness of the Films]

By using 1737 glass manufactured by Corning Incorporated as a substrate, films with thickness of 500 nm were deposited under the above-described deposition condition. Then, indentation hardness was measured with a super-micro indentation tester (Model ENT-1100a manufactured by ELIONIX Corporation Ltd.) at the indentation load of 35 mgf. First, the substrates were set in the apparatus at 27° C. Then, after 1 hour or longer has passed, the indentation hardness measurement was performed. The measured value was expressed as the average value of multiple raw data measured at 10 different points

[Breakage of Films]

Films were deposited in the thickness of 100 nm on a PET film having thickness of 0.1 mm under deposition condition described above. After bending the film 10 times, the presence or absence of the breakage of the films was monitored by observing the surface of the film with a microscope (magnification rate: 1000-fold). When the deposition was made by radio frequency (RF) sputtering, it was labeled by a "*" mark.

[XRD of Films]

Sample preparation: Analysis samples were prepared by depositing films in 300 nm of thickness on 1737 glass substrate manufactured by Corning Incorporated Apparatus: RINT-Ultima/PC manufacture by Rigaku Coropration Tube: Cu
Tube voltage: 40 kV
Tube current: 40 mA
Scanning range (2θ): 50° to 80°
Slit size: Divergence (DS) ⅔ degree, Scanning (SS) ⅔ degree, Reception of light (RS) 0.8 mm
Width of measurement step: 0.02 degree in 2θ
Scanning rate: 2 degree per minute
Rotation speed of sample platform: 30 rpm When no peak was observed, it was indicated by a "○" mark. When a distinctive diffraction peak was observed, it was indicated by a "×" mark.

[XRD of Targets]

Sample preparation: Analysis samples were prepared by wet-polishing targets with SiC-Paper (grit 180) and then by drying the polished targets.

Presence or absence of SnO₂ phase was monitored by measuring the ratio of the peak near 27° corresponding to SnO₂ to the peak near 34° corresponding to Zn₂SnO₄.

Evaluation results of: the oxide sputtering targets of Examples 1-26 and Comparative Examples 1-8; and the protective films of Examples 1-26 and Comparative Examples 1-8 deposited by using them, are shown in Tables 4 and 5.

TABLE 4

| | Specific density (%) | Specific resistance (Ω·cm) | Number of abnormal discharges (times/hour) | Amount of particles |
|---|---|---|---|---|
| Ex. 1 | 92.8 | 5.8E−02 | 2 | Low |
| Ex. 2 | 92.6 | 9.0E−01 | 8 | Low |
| Ex. 3 | 92.4 | 1.3E−02 | 1 | Low |
| Ex. 4 | 95.8 | 6.6E−02 | 1 | Low |
| Ex. 5 | 96.7 | 1.2E−01 | 2 | Low |
| Ex. 6 | 95.5 | 8.7E−03 | 1 | Low |
| Ex. 7 | 94.5 | 3.4E−02 | 0 | Low |
| Ex. 8 | 94.3 | 5.2E−02 | 0 | Low |
| Ex. 9 | 98.8 | 5.8E−02 | 1 | Low |
| Ex. 10 | 92.8 | 4.8E−02 | 0 | Low |
| Ex. 11 | 94.8 | 5.0E−02 | 0 | Low |
| Ex. 12 | 95.7 | 6.4E−02 | 3 | Low |
| Ex. 13 | 98.2 | 7.7E−02 | 2 | Low |
| Ex. 14 | 94.2 | 4.4E−02 | 1 | Low |
| Ex. 15 | 95.8 | 6.7E−02 | 4 | Low |
| Ex. 16 | 94.9 | 7.1E−02 | 4 | Very low |
| Ex. 17 | 98.2 | 9.2E−02 | 5 | Very low |
| Ex. 18 | 99.1 | 8.1E−01 | 15 | Very low |
| Ex. 19 | 95.6 | 6.6E−02 | 4 | Low |
| Ex. 20 | 97.6 | 8.1E−02 | 4 | Very low |
| Ex. 21 | 99.9 | 7.9E−02 | 6 | Very low |
| Ex. 22 | 95.8 | 9.9E−02 | 6 | Very low |
| Ex. 23 | 97.7 | 8.7E−02 | 5 | Very low |
| Ex. 24 | 97.6 | 9.1E−02 | 6 | Very low |
| Ex. 25 | 98.1 | 8.4E−02 | 7 | Very low |
| Ex. 26 | 93.5 | 8.3E−02 | 8 | Very low |
| C. Ex. 1 | 95.5 | 8.2E+00 | DC sputtering not possible | Low |
| C. Ex. 2 | 94.5 | 9.5E−01 | 89 | High |
| C. Ex. 3 | 93.7 | 1.1E−03 | 0 | Low |
| C. Ex. 4 | 93.4 | 9.5E+00 | DC sputtering not possible | Very low |
| C. Ex. 5 | 92.8 | 1.1E+01 | DC sputtering not possible | Very low |
| C. Ex. 6 | 95.4 | 1.0E+01 | DC sputtering not possible | Very low |
| C. Ex. 7 | 99.9 | Not in measurable range | DC sputtering not possible | Low |
| C. Ex. 8 | 99.4 | 1.5E−04 | 15 | High |

TABLE 5

| | Indentation hardness (mgf/μm²) | Film breakage | Specific resistance of film (Ω·cm) | XRD of film | Variation of reflectance (%) @ 405 nm | SnO₂ peak |
|---|---|---|---|---|---|---|
| Ex. 1 | 784 | No | 6.5E+02 | ○ | 0.4 | ≤1/100 |
| Ex. 2 | 700 | No | 2.3E+02 | ○ | 0.7 | ≤1/100 |
| Ex. 3 | 744 | No | 1.3E+03 | ○ | 0.7 | ≤1/100 |
| Ex. 4 | 767 | No | 4.2E+02 | ○ | 0.3 | ≤1/100 |
| Ex. 5 | 704 | No | 5.9E+02 | ○ | 0.9 | ≤1/100 |
| Ex. 6 | 795 | No | 1.4E+00 | ○ | 0.1 | ≤1/100 |
| Ex. 7 | 783 | No | 5.9E+02 | ○ | 0.4 | ≤1/100 |
| Ex. 8 | 777 | No | 4.9E+02 | ○ | 1.0 | ≤1/100 |
| Ex. 9 | 758 | No | 7.1E+02 | ○ | 0.6 | ≤1/100 |
| Ex. 10 | 743 | No | 5.1E+02 | ○ | 0.5 | ≤1/100 |
| Ex. 11 | 715 | No | 4.8E+02 | ○ | 0.7 | ≤1/100 |
| Ex. 12 | 754 | No | 6.6E+02 | ○ | 0.1 | ≤1/100 |
| Ex. 13 | 746 | No | 4.3E+02 | ○ | 0.6 | ≤1/100 |
| Ex. 14 | 734 | No | 5.4E+02 | ○ | 0.4 | ≤1/100 |
| Ex. 15 | 766 | No | 4.2E+02 | ○ | 0.5 | ≤1/100 |
| Ex. 16 | 745 | No | 3.2E+03 | ○ | 0.5 | ≤1/100 |
| Ex. 17 | 788 | No | Not in measurable range | ○ | 0.3 | ≤1/100 |
| Ex. 18 | 786 | No | Not in measurable range | ○ | 0.9 | ≤1/100 |
| Ex. 19 | 743 | No | 9.5E+02 | ○ | 0.8 | ≤1/100 |
| Ex. 20 | 758 | No | 2.3E+03 | ○ | 0.3 | ≤1/100 |
| Ex. 21 | 766 | No | Not in measurable range | ○ | 0.2 | ≤1/100 |
| Ex. 22 | 755 | No | Not in measurable range | ○ | 0.6 | ≤1/100 |
| Ex. 23 | 758 | No | Not in measurable range | ○ | 0.6 | ≤1/100 |
| Ex. 24 | 767 | No | Not in measurable range | ○ | 0.9 | ≤1/100 |
| Ex. 25 | 751 | No | Not in measurable range | ○ | 0.8 | ≤1/100 |
| Ex. 26 | 782 | No | Not in measurable range | ○ | 0.4 | ≤1/100 |
| C. Ex. 1 | 833 | *Yes | Not in measurable range | ○ | 0.5 | ≤1/100 |
| C. Ex. 2 | 690 | No | 1.9E+02 | ○ | 0.6 | 6/100 |
| C. Ex. 3 | 834 | Yes | 1.5E−01 | x | 0.3 | ≤1/100 |
| C. Ex. 4 | 777 | *No | Not in measurable range | ○ | 0.5 | ≤1/100 |
| C. Ex. 5 | 797 | *No | Not in measurable range | ○ | 0.6 | ≤1/100 |
| C. Ex. 6 | 734 | *No | Not in measurable range | ○ | 0.2 | ≤1/100 |
| C. Ex. 7 | 568 | *No | Not in measurable range | ○ | −8.9 | — |
| C. Ex. 8 | 778 | Yes | 3.4E+01 | ○ | 0.2 | — |

As shown in the above-indicated evaluation results, specific resistance was 0.1 Ω·cm or less in the oxide sputtering targets of Examples 1-26. At the same time, the number of abnormal discharges was extremely low and the amount of particles was less. Contrary to that, specific resistant was high, in a case higher than the upper limit of measurable range, in the oxide sputtering targets of Comparative Examples 1, 4, 5, 6, and 7, making it impossible to perform the direct-current (DC) sputtering. Thus, in regard to the oxide sputtering targets of Comparative Examples 1, 4, 5, 6, and 7, film deposition was performed by the radio frequency (RF) sputtering. In the oxide sputtering targets of Examples 1-26 and Comparative Examples 1-8, the specific density was 90% or more.

Also, in regard to the indentation hardness showing flexibility (softness) of the protective film, the indentation hardness exceeded 800 mgf/μm² in Comparative Examples 1 and 3. In these protective films, breakage of film occurred. Contrary to that, the indentation hardness was 800 mgf/μm² or less in the protective films of Examples 1-26, resulting in films with flexibility compared to Comparative Examples 1 and 3. Accordingly, there was no film breakage in the protective films of Examples 1-26. In the protective film of Comparative Example 8, which was ITO film, film breakage occurred.

Furthermore, in regard to variation of reflectance, there was only low variation rate, which was 1.0% or less, in the protective films of Examples 1-26 compared to Comparative Example 7 in which ZnS—SiO₂ was used and there was high variation rate. In the protective films of Examples 1-26, high storage stability was obtained.

The protective films of Examples 1-26 were in amorphous form in an ordinary temperature.

Next, X-ray diffraction (XRD) analysis was performed on each of the oxide sputtering targets of Examples 1-26. In the analysis, the diffraction peak originated from ZnO and the diffraction peak originated from $Zn_2SnO_4$, which was a composite oxide of $SnO_2$ and ZnO, were detected. Thus, existence of ZnO phase and $Zn_2SnO_4$ phase were confirmed.

Figure 2:
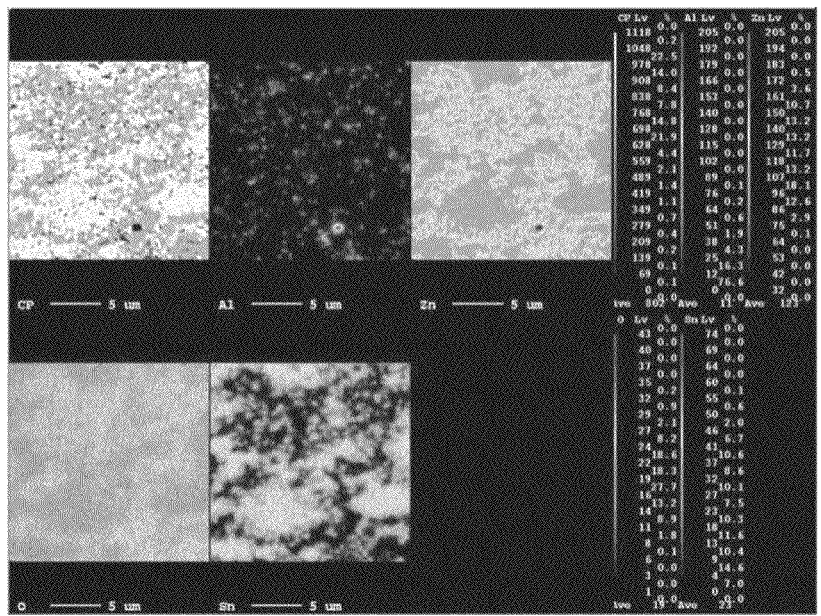
FIG. 2 is an element distribution image on a cross-sectional texture of the oxide sputtering target related to the present invention. Each of elements are measured by EPMA.
Figure 3:
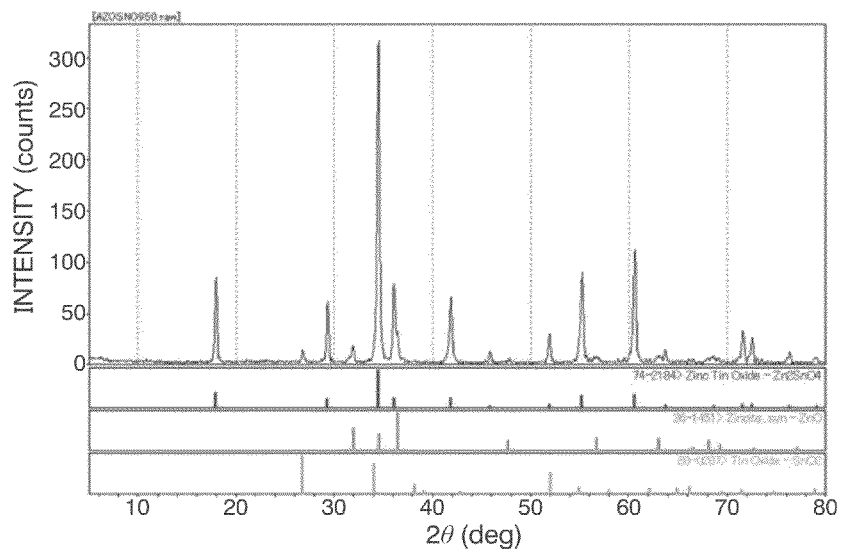
FIG. 3 is a graph showing results of X-ray diffraction (XRD) analysis of the oxide sputtering target related to a comparative example.
Figure 4:
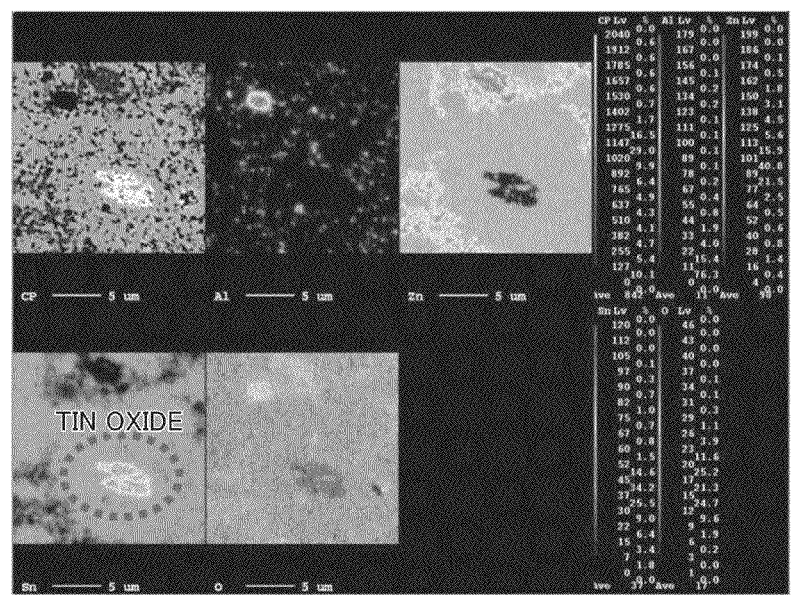
FIG. 4 is an element distribution image on a cross-sectional texture of the oxide sputtering target related to a comparative example. Each of elements are measured by EPMA.

As references, a graph showing results of X-ray diffraction (XRD) analysis of the oxide sputtering target of Comparative Example 2 is shown in FIG. 3. Also, by EPMA (field-emission electron probe), a backscattered electron image (CP) and an element distribution image showing composition distribution of each element were obtained and shown in FIG. 4. The way to interpret the element distribution image obtained by EPMA is the same as in the case of FIG. 2. Based on these images, it can be understood that: 1) the texture of the target was made of ZnO phase and $Zn_2SnO_4$ phase, and Al was selectively dispersed in the ZnO phase in the element distribution image of the oxide sputtering target related to the present invention shown in FIG. 2; and 2) $ZnO_2$ phase existed in the phase whose major component is ZnO in the oxide sputtering target of Comparative Example 2. The portion corresponding to the above-explained characteristics is indicated by the enclosure with a broken line in FIG. 4. Presence of $SnO_2$ phase was also confirmed by the fact that the peak of $SnO_2$ in the XRD graph indicated 6/100.

In order to utilize the present invention as the oxide sputtering targets, it is preferable that: surface roughness being 5.0 μm or less, more preferably being 1.0 μm or less; the grain size being 20 μm or less, more preferably 10 μm or less; the concentration of metal-based impurities being 0.1 atomic % or less, more preferably 0.05 atomic % or less; and the flexural strength being 50 MPa or more, more preferably 100 MPa or more. The oxide sputtering targets of Examples 1-26 satisfied all the above-mentioned criteria.

The scope of the present invention is not particularly limited by the above-explained descriptions of Embodiments or Examples. Therefore, modifications can be made in the present invention within the scope of the present invention.

For example, the pressure sintering was performed by the hot press procedure in Embodiments and Examples, the process can be done by the hot isostatic pressure type sintering method (HIP method) alternatively, for example.

INDUSTRIAL APPLICABILITY

A protective film for an optical recording media, which is suitable for utilization to the dielectric material protective film of BD which uses an organic dye as a recording layer, can be provided.

The invention claimed is:

1. A oxide sputtering target made of an oxide sintered body comprising:
    with respect to a total content amount of metal compositions, 0.15 at % or more of one or more of Al, Ga, and In as a total content amount;
    7 at % or more of Sn; and
    the balance Zn and inevitable impurities,
    wherein a total content amount of Al, Ga, In, and Sn is 36 at % or less,
    wherein the sputtering target comprises ZnO phase and $Zn_2SnO_4$ phase, and
    wherein a ratio of a peak near 27° corresponding to $SnO_2$ to a peak near 34° corresponding to $Zn_2SnO_4$ is 1/100 or less.

2. A oxide sputtering target made of an oxide sintered body comprising:
    with respect to a total content amount of metal compositions, 0.15 at % or more of one or more of Al, Ga, and In as a total content amount;
    7 at % or more of Sn;
    1.0 to 20.0 at % of one or more of Ge and Cr as a total content amount; and
    the balance Zn and inevitable impurities,
    wherein a total content amount of Al, Ga, In, and Sn is 36 at % or less,
    wherein the sputtering target comprises ZnO phase and $Zn_2SnO_4$ phase, and
    wherein a ratio of a peak near 27° corresponding to $SnO_2$ to a peak near 34° corresponding to $Zn_2SnO_4$ is 1/100 or less.

3. A protective film, which is deposited by sputtering using the oxide sputtering target according to claim 1,
    wherein the protective film is an oxide with a component composition comprising:
        with respect to a total content amount of metal compositions, 0.15 at % or more of one or more of Al, Ga, and In as a total content amount;
        7 at % or more of Sn; and
        the balance Zn and inevitable impurities,
    wherein a total content amount of Al, Ga, In, and Sn is 36 at % or less.

4. A protective film, which is deposited by sputtering using the oxide sputtering target according to claim 2,
    wherein the protective film is an oxide with a component composition comprising:
        with respect to a total content amount of metal compositions, 0.15 at % or more of one or more of Al, Ga, and In as a total content amount;
        7 at % or more of Sn;
        1.0 to 20.0 at % of one or more of Ge and Cr as a total content amount; and
        the balance Zn and inevitable impurities,
    wherein a total content amount of Al, Ga, In, and Sn is 36 at % or less.

* * * * *